US009627969B2

(12) United States Patent
Tschirhart et al.

(10) Patent No.: US 9,627,969 B2
(45) Date of Patent: Apr. 18, 2017

(54) INDUCTOR CURRENT MEASUREMENT COMPENSATION FOR SWITCHING VOLTAGE REGULATORS (71) Applicant: Infineon Technologies Austria AG, Villach (AT)

(72) Inventors: Darryl Tschirhart, Torrance, CA (US); Benjamim Tang, Rancho Palos Verdes, CA (US); Amir Babazadeh, Laguna Hills, CA (US); Tim Ng, Monterey Park, CA (US)

(73) Assignee: Infineon Technologies Austria AG, Villach (AT)

( * ) Notice: Subject to any disclaimer, the term of this patent is extended or adjusted under 35 U.S.C. 154(b) by 206 days.

(21) Appl. No.: 14/287,978

(22) Filed: May 27, 2014

(65) Prior Publication Data
US 2015/0349634 A1 Dec. 3, 2015

(51) Int. Cl.
*H02M 3/158* (2006.01)
*G01R 19/32* (2006.01)
*H02M 3/156* (2006.01)
*G01R 19/25* (2006.01)
*H02M 1/00* (2006.01)

(52) U.S. Cl.
CPC ............ *H02M 3/158* (2013.01); *G01R 19/25* (2013.01); *G01R 19/32* (2013.01); *H02M 3/156* (2013.01); *H02M 2001/0009* (2013.01)

(58) Field of Classification Search
CPC ... G05F 1/00; H02M 1/32; H02M 2001/0009; H02M 2001/0022; H02M 2001/0025; H02M 2003/1566
See application file for complete search history.

(56) References Cited

U.S. PATENT DOCUMENTS 5,982,160 A * 11/1999 Walters .................. H02M 3/156
323/222
6,424,129 B1 * 7/2002 Lethellier ........... H02M 3/1584
323/272
6,469,481 B1 * 10/2002 Tateishi .............. H02M 3/1588
323/282

(Continued)

OTHER PUBLICATIONS

Unknown, Author, "Dual Output Digital Multi-Phase Controller", International Rectifier, Product Brief, IR3564A, IR3570A, IR World Headquarters, El Segundo, California, Aug. 9, 2012, pp. 1-4.

(Continued)

*Primary Examiner* — Timothy J Dole
*Assistant Examiner* — Yusef Ahmed
(74) *Attorney, Agent, or Firm* — Murphy, Bilak & Homiller, PLLC (57) ABSTRACT

A current estimation method for a switching voltage regulator that delivers current to a load through an inductor includes measuring a voltage across a capacitor of an RC current sense network coupled in parallel with the inductor, generating an estimate of the current through the inductor based on the voltage measured across the capacitor of the RC current sense network and adjusting the estimate of the current through the inductor by a compensation filter that compensates for variation in the inductance of the inductor as a function of at least one of temperature and current.

22 Claims, 5 Drawing Sheets

(56) References Cited

U.S. PATENT DOCUMENTS

| | | | |
|---|---|---|---|
| 6,646,450 B2* | 11/2003 | Liebler | G01R 19/0092 323/272 |
| 7,233,132 B1* | 6/2007 | Dong | H02M 3/1584 323/272 |
| 7,315,153 B2* | 1/2008 | Tazawa | H02M 3/1584 323/272 |
| 7,436,189 B2* | 10/2008 | Pai | G06F 1/28 323/282 |
| 7,508,182 B1* | 3/2009 | Chang | H02M 3/1588 323/282 |
| 7,859,324 B2* | 12/2010 | Yamashita | H02M 1/32 323/316 |
| 7,986,254 B1* | 7/2011 | Lakshmikanthan | G01R 19/0092 341/120 |
| 8,395,368 B2* | 3/2013 | Ouyang | H02M 3/1588 323/259 |
| 8,508,198 B2* | 8/2013 | Tong | G06F 1/26 323/272 |
| 9,240,720 B2* | 1/2016 | Tateishi | H02M 3/158 |
| 2003/0071636 A1* | 4/2003 | Liebler | G01R 19/0092 324/630 |
| 2005/0179423 A1* | 8/2005 | Xing | H02M 3/1588 323/282 |
| 2006/0001408 A1* | 1/2006 | Southwell | H02M 3/1584 323/282 |
| 2007/0063681 A1* | 3/2007 | Liu | H02M 3/1588 323/282 |
| 2007/0075711 A1* | 4/2007 | Blanc | G01R 19/0092 324/713 |
| 2007/0241727 A1* | 10/2007 | Luo | H02M 3/1588 323/272 |
| 2008/0203997 A1* | 8/2008 | Foran | H02M 3/1588 324/76.11 |
| 2008/0278123 A1* | 11/2008 | Mehas | H02M 3/1588 323/266 |
| 2008/0297957 A1* | 12/2008 | Mehas | H02M 1/32 361/18 |
| 2009/0146621 A1* | 6/2009 | Tang | H02M 3/1584 323/234 |
| 2009/0146635 A1* | 6/2009 | Qiu | H02M 3/156 323/290 |
| 2009/0146643 A1* | 6/2009 | Ostrom | H02M 3/156 324/123 R |
| 2009/0261797 A1* | 10/2009 | Shibata | H02M 1/36 323/288 |
| 2010/0320974 A1* | 12/2010 | Manlove | H02M 3/157 323/222 |
| 2011/0156687 A1* | 6/2011 | Gardner | H02M 3/156 323/284 |
| 2011/0279133 A1* | 11/2011 | Harper | G01R 19/0092 324/691 |
| 2012/0153917 A1* | 6/2012 | Adell | H02M 3/1588 323/283 |
| 2012/0194161 A1* | 8/2012 | Latham, II | H02M 3/156 323/286 |
| 2012/0194258 A1 | 8/2012 | Nien et al. | |
| 2012/0200277 A1* | 8/2012 | Silva | G01R 19/003 323/284 |
| 2013/0077796 A1* | 3/2013 | Risbo | H04R 3/007 381/55 |
| 2013/0249518 A1* | 9/2013 | Giannopoulos | H02M 3/156 323/284 |
| 2014/0292300 A1* | 10/2014 | Yan | H02M 3/156 323/288 |
| 2014/0306680 A1* | 10/2014 | Liu | G05F 1/468 323/288 |
| 2015/0022171 A1* | 1/2015 | Chen | H02M 3/158 323/282 |
| 2015/0100174 A1* | 4/2015 | Li | H02M 3/156 700/298 |
| 2015/0207400 A1* | 7/2015 | Shenoy | H02M 3/1584 323/213 |

OTHER PUBLICATIONS

Unknown, Author, "Multiphase PWM Regulator for AMD Fusion Mobile CPUs Using SVI 2.0", Intersil Americas LLC, ISL62771, Feb. 8, 2013, pp. 1-35.

Hua, Lei et al., "Design Considerations of Time Constant Mismatch Problem for Inductor DCR Current Sensing Method", Twenty-First Annual IEEE Applied Power Electronics Conference and Exposition, 2006, APEC '06, pp. 1368-1374.

* cited by examiner

INDUCTOR CURRENT MEASUREMENT COMPENSATION FOR SWITCHING VOLTAGE REGULATORS

TECHNICAL FIELD

The present application relates to switching voltage regulators, in particular inductor current measurement compensation for switching voltage regulators.

BACKGROUND

Switching voltage regulators are widely used in modern electronic systems for a variety of applications such as computing (server and mobile) and POLs (Point-of-Load Systems) for telecommunications because of their high efficiency and small amount of area/volume consumed by such converters. Widely accepted switching voltage regulator topologies include buck, boost, buck-boost, forward, flyback, half-bridge, full-bridge, and SEPIC topologies. Multiphase buck converters are particularly well suited for providing high current at low voltages needed by high-performance integrated circuits such as microprocessors, graphics processors, and network processors. Buck converters are implemented with active components such as a pulse width modulation (PWM) controller IC (integrated circuit), driver circuitry, one or more phases including power MOSFETs (metal-oxide-semiconductor field-effect transistors), and passive components such as inductors, transformers or coupled inductors, capacitors, and resistors. Multiple phases (power stages) can be connected in parallel to the load through respective inductors to meet high output current requirements.

Accurate knowledge of the current being supplied by a switching voltage regulator is required for safe, robust operation. Incorrect current measurement can lead to premature tripping over-current protection (OCP), which is undesirable in high-reliability applications such as servers in data centers, or failure to trip OCP which can lead to catastrophic device failure. In either case, incorrect current information causes an incorrect output voltage set point that may be out of compliance with product specifications.

The standard technique for ascertaining the current through an inductor in a switching voltage regulator is known as DCR sensing which exploits the non-ideal DC resistance (DCR) of the inductor. The DCR of an inductor is specified at nominal conditions in the datasheet for off-the-shelf components, or may be calculated or measured in custom designs. With DCR sensing, a resistor-capacitor (RC) sense network is connected in parallel with the inductor and the voltage across the capacitor represents the voltage across the DCR, meaning the current through the inductor is related to the ratio of the capacitor voltage to DCR value. For a static, DC current through the load, the DC value across the capacitor is proportional to the DC current through the inductor and the DCR of the inductor. For dynamic currents, such as a changing current through the load or a ripple current through the inductor, the instantaneous value across the capacitor is proportional to the instantaneous current through the inductor if the time constant of the RC network matches that of the inductance and DCR of the inductor. However, inductance and DCR vary with temperature, meaning the current information is only accurate at the temperature where the time constants match.

Many conventional switching voltage regulators use a negative temperature coefficient thermistor (NTC) network to augment the DCR measurement. The NTC network for DCR compensation typically is separate from the NTC network for over temperature protection (OTP), increasing overall system cost, component count and signal routing complexity. In addition, the temperature compensation NTC network does not contain useful information. Instead, the temperature compensation NTC network is a manually tuned unintelligent network. As a result, the network is specific to the platform on which it is used. Changing design parameters with thermal implications (e.g. board layer count, air flow, components with lower efficiency, etc.) require a hardware change to re-tune the NTC network. Also, component tolerances of the NTC network introduce additional error in the current measurement and the NTC technique for DCR compensation is only viable for DC measurements. As such, the dynamic or AC value of current is uncompensated.

SUMMARY

According to an embodiment of a method of current estimation for a switching voltage regulator that delivers current to a load through an inductor, the method comprises: measuring a voltage across a capacitor of an RC current sense network coupled in parallel with the inductor; generating an estimate of the current through the inductor based on the voltage measured across the capacitor of the RC current sense network; and adjusting the estimate of the current through the inductor by a compensation filter that compensates for variation in the inductance of the inductor as a function of at least one of temperature and current.

According to an embodiment of a controller for controlling operation of a switching voltage regulator that delivers current to a load through an inductor, the controller comprises an RC current sense network coupled in parallel with the inductor, a current estimator and a compensation filter. The current estimator is operable to generate an estimate of the current through the inductor based on a voltage measured across the capacitor of the RC current sense network. The compensation filter is operable to adjust the estimate of the current through the inductor by compensating for variation in the inductance of the inductor as a function of at least one of temperature and current.

According to an embodiment of a multiphase switching voltage regulator, the multiphase switching voltage regulator comprises a plurality of phases operable to deliver current to a load, each phase being connected to the load through an inductor, an RC current sense network coupled in parallel with each of the inductors, a current estimator, and a compensation filter. The current estimator is operable to generate an estimate of the individual currents through the inductors based on a voltage measured across the capacitors of the RC current sense networks, and generate a total current estimate based of the individual current estimates for the inductors. The compensation filter is operable to adjust the total current estimate by compensating for variation in the inductance of the inductors as a function of at least one of temperature and current.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Embodiments described herein provide DCR-based current estimation techniques that compensate for variation between the DCR and phase inductance. In some embodiments, actual temperature readings for the switching voltage regulator are used to implement the current estimate compensation. The same temperature measurement used to compensate the DCR-based current estimation process can also be used in over-current and over-temperature protection processes. In other embodiments, the current-dependency of the phase inductance is used to implement the current estimate compensation. Still other types of compensation can be used such as voltage or frequency compensation. In each case, both steady-state (DC) and transient (AC) load conditions can be mitigated based on the current estimate compensation techniques described herein by using a compensation filter that has a non-constant frequency response.

Figure 1:
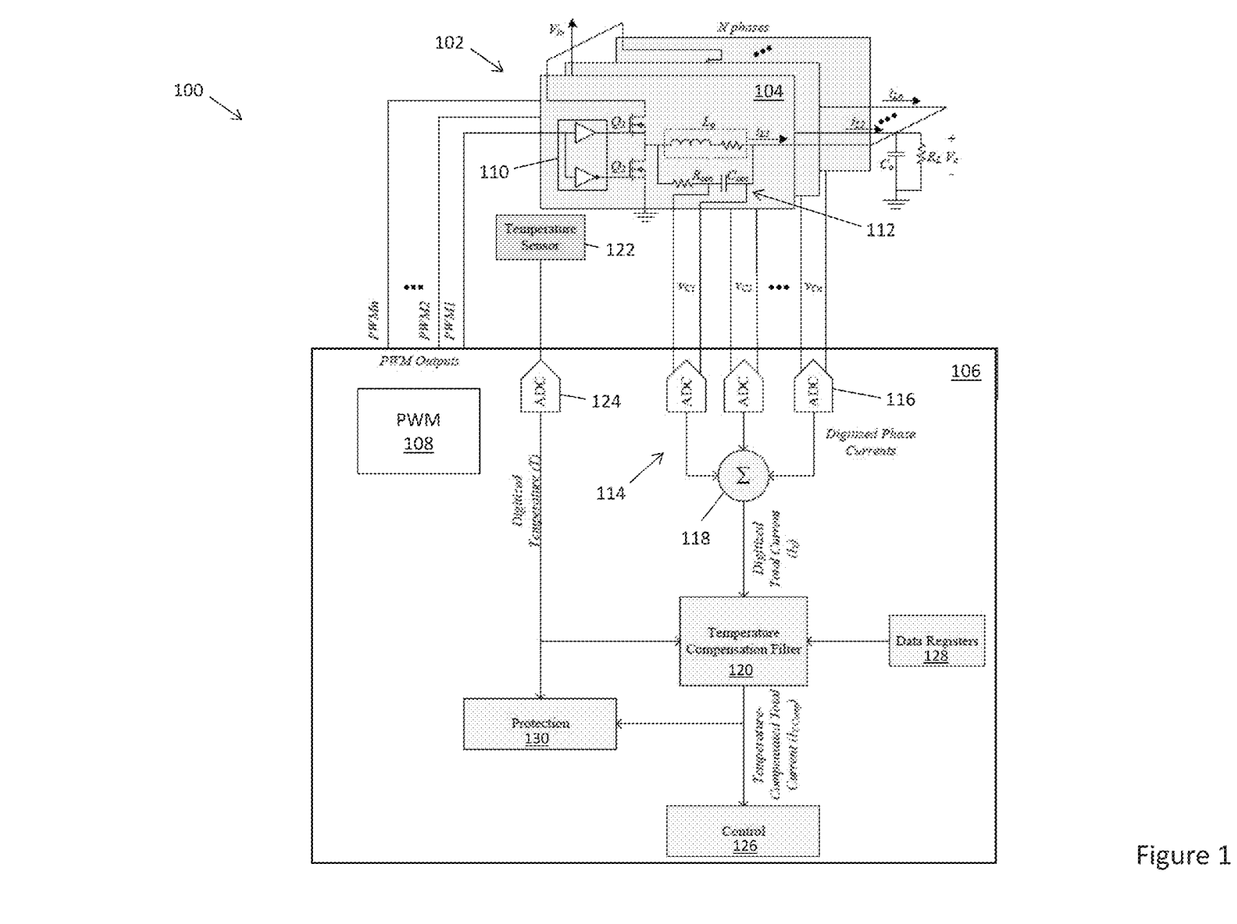
FIG. 1 illustrates a block diagram of an embodiment of a multiphase switching voltage regulator having inductor DCR current sense with compensation.

FIG. 1 illustrates an embodiment of a switching voltage regulator 100 comprising a power stage 102 including a plurality of phases 104 and a controller 106 such as a microcontroller, microprocessor, ASIC (application-specific integrated-circuit), etc. for controlling operation of the power stage 102. Each phase 104 is operable to deliver a phase current ($I_{Ln}$) through a separate inductor ($L_O$) to a load connected to the switching voltage regulator 100 via the inductors and an output capacitor ($C_O$). The load can be a high-performance integrated circuit such as a microprocessor, graphics processor, network processor, etc. or other type of integrated circuit requiring voltage regulation such as a POL (point-of-load). The load is represented by resistor $R_L$ in FIG. 1.

Each phase 104 has a high-side transistor (Q1) and a low-side transistor (Q2) for coupling to the load through the corresponding inductor. The high-side transistor of each phase 104 switchably connects the load to an input voltage (Vin) of the switching voltage regulator 100, and the corresponding low-side transistor switchably connects the load to ground at different periods. N phases are shown in FIG. 1. The power stage 102 can include any number of phases including a single phase or more than one phase.

The controller 106 regulates the voltage ($V_O$) delivered to the load by the power stage 102, by adjusting the phase currents delivered to the load. The controller 106 can include a pulse width modulator (PWM) 108 for switching each phase 104 of the power stage 102 via a corresponding PWM control signal (PWM1, PWM2, . . . , PWMn) so that the power stage 102 sources or sinks current to the load through the corresponding inductor and the high-side or low-side transistor. When the PWM control signal is at a logic level high, the high-side transistor is placed in a conductive state, the inductor current is sourced or sunk through the high-side transistor, and the current through the inductor increases for the duration. This is generally referred to as the 'on-time' and the power stage 102 is considered to be 'turned on'. When the PWM control signal is at a logic level low, the low-side transistor is placed in a conductive state, current is sourced or sunk from the low-side transistor, and the current through the inductor decreases for the duration. This is generally referred to as the 'off-time' and the power stage 102 is considered to be 'turned off'. When the PWM control signal is at a trivalent or high impedance logic level (the PWM control signal is neither high nor low), both the high-side and the low-side transistors are placed in a non-conductive state, current is sourced or sunk through either the low-side or high side transistor body diodes, and the magnitude of the current through the inductor decreases towards zero. This is generally referred to as the 'HiZ-time' or 'inactive time' and the power stage 102 is considered to be in 'High Z' or inactive.

The switching voltage regulator 100 can source or sink current, and each inductor current has an expected sawtooth or triangular shape or ripple pattern, since the inductor currents must be either decreasing or increasing depending on which transistor is conductive. In DCM (discontinuous conduction mode), the low-side transistor is not allowed to be conductive when the inductor current is zero. The cycle then consists of an on-time, followed by an off-time, followed by a HiZ time. During the HiZ time, the inductor current approaches zero and does not change for the duration of the cycle once it is near zero.

In either CCM or DCM, drivers 110 of the power stage 102 provide gate drive signals to the gates of the high-side and low-side transistors of the corresponding phases 104 in response to the PWM control signals provided by the controller 106. The activation state of the phases 104 and the duty cycle of the high-side and low-side transistors are determined at least in part based on the output voltage ($V_O$) applied to the load so that the switching voltage regulator 100 can react as quickly and reliably as possible to changing load conditions.

The controller 106 can manage changes from one reference voltage to another. The controller 106 can also determine errors between the output voltage ($V_O$) and a reference voltage, and convert the error voltage into a digital representation provided to the PWM 108 for modifying the switching cycle of the phases 104 e.g. by adjusting the duty cycle. Such voltage regulation functions are standard in typical digitally-controlled switching voltage regulators, and therefore no further explanation is given in this regard.

In addition to regulating the voltage delivered to the load, the controller 106 also monitors the phase currents delivered by the phases 104 to the load e.g. by measuring the phase currents ($I_{Ln}$) injected into the corresponding inductors by DCR sensing. The controller 106 estimates the total current delivered to the load by the switching voltage regulator 100 based on the phase currents measured by DCR sensing.

Figure 2:
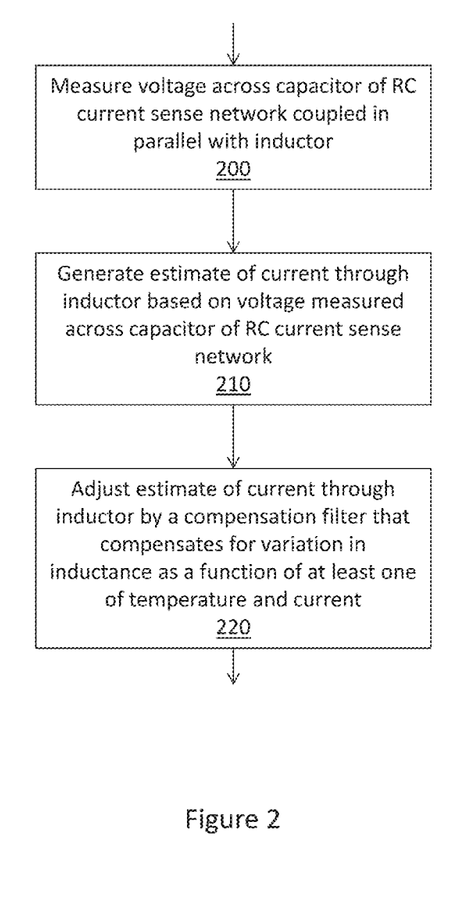
FIG. 2 illustrates a flow diagram of an embodiment of a method of compensation for a switching voltage regulator having inductor DCR current sense.

The current estimation method implemented by the switching voltage regulator controller 106 is explained next in more detail with reference to FIG. 2. The power stage 102 of the switching voltage regulator 100 includes an RC current sense network 112 coupled in parallel with each phase 104. The RC current sense network 112 includes a resistor ($R_{sen}$) connected in series with a capacitor ($C_{sen}$).

The RC current sense network 112 accounts for the DCR (non-ideal DC resistance) of the inductor. The voltage ($V_{Cn}$) measured across the capacitor ($C_{sen}$) represents the voltage across the DCR of that inductor, meaning the current ($I_{Ln}$) through the inductor is related to the ratio of the capacitor voltage to DCR value (Block 200).

The controller 106 includes a current sensor 114 generating an estimate of the current through each inductor based on the voltage ($V_{C1}$, $V_{C2}$, ... $V_{Cn}$) measured across the capacitors of the respective RC current sense networks (Block 210). In one embodiment, the controller 106 is a digital controller and the current sensor 114 comprises an ADC (analog-to-digital converter) 116 for converting the individual voltages ($V_{C1}$, $V_{C2}$, ... $V_{Cn}$) measured by the DCR sense networks 112 to a corresponding digital value. The digitized values output by the ADCs 116 represent the individual phase current estimates, which are summed 118 to provide a digitized total current estimate ($I_T$). In the case of a single-phase switching voltage regulator, the regulator includes only one output inductor (L) and the summing stage 118 can be omitted. In this case, the digitized total current estimate $I_T$ shown in FIG. 1 is the current estimate determined for the single inductor.

The controller 106 includes a compensation filter 120 for adjusting the estimate of the digitized total current estimate $I_T$ (Block 220). According to the embodiment of FIG. 1, the compensation filter 120 is a temperature compensation filter that compensates for variation in the DCR of the inductors as a function of temperature. To this end, the switching voltage regulator 100 also includes a temperature sensor 122 for measuring the temperature of the switching voltage regulator 100. The temperature sensor 122 can be placed at or near the power stage 102 if desired. Any standard temperature sensor that outputs a voltage, current, or resistance that varies with temperature and that can be converted to an actual temperature reading can be employed. Again in the case of a digital architecture, the controller 106 can include an ADC 124 for converting the measured temperature reading to a corresponding digitized value (T). The controller 106 uses the measured temperature of the switching voltage regulator 100 as part of current estimation and over-temperature protection processes and other control processes 126 implemented by the controller 106.

In one embodiment, the temperature compensation filter 120 generates a temperature-compensated total current estimate ($I_{T,comp}$) based on the total current estimate ($I_T$) generated by the current sensor 114 and a plurality of filter coefficients that are a function of the measured temperature (T). The filter coefficients are also a function of other parameters related to the RC current sense networks 112, output inductors ($L_O$), and operation of the controller 106. These additional parameters can be stored in data registers 128 of the controller 106. The temperature compensation filter 120 can mitigate temperature-dependent measurement error during both steady-state (DC) and transient (AC) conditions. For example, the temperature compensation filter 120 can have a non-constant frequency response. A digital embodiment of the temperature compensation filter 120 is described in greater detail later herein with reference to FIG. 3.

The controller 106 further includes an over-temperature protection circuit 130 that provides over-temperature protection for the regulator 100. The over-temperature protection circuit 130 can shut down the switching voltage regulator 100 if regulator operation cannot be maintained without exceeding some positive or negative temperature limit. The over-temperature protection circuit 130 implements the over-temperature protection scheme based on the same measured temperature (T) used to compensate for the temperature variation between the DCR and inductance of the inductor. This way additional temperature sensors for the phases 104 can be omitted, reducing system size and cost. Any standard over-temperature protection circuit can be used.

Figure 3:
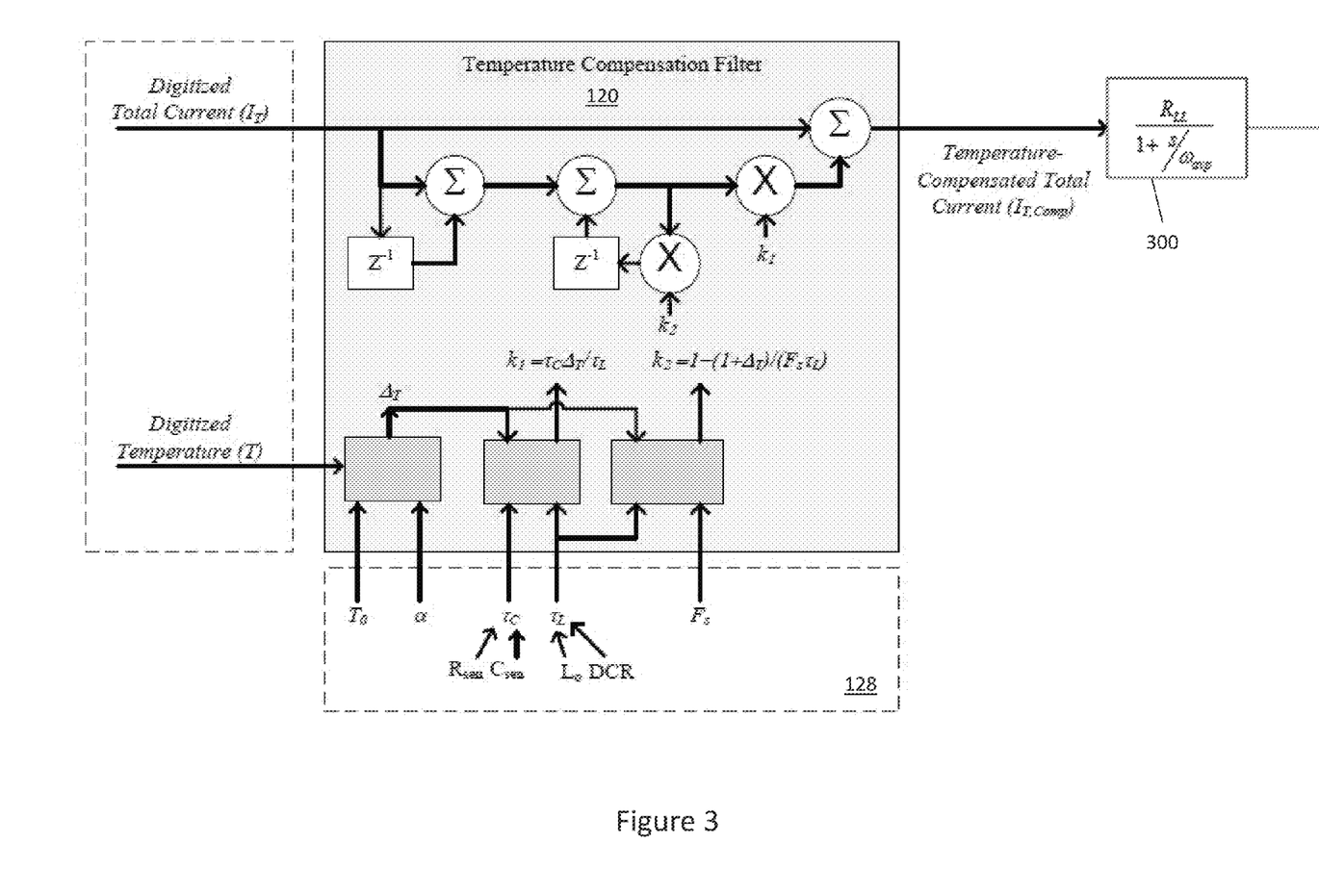
FIG. 3 illustrates a block diagram of an embodiment of a compensation filter that provides temperature compensation to a multiphase switching voltage regulator with inductor DCR current sense.

FIG. 3 illustrates an embodiment of the temperature compensation filter 120 included in or associated with the switching voltage regulator controller 106. According to this embodiment, the temperature compensation filter 120 is a digital filter having a non-constant frequency response in order to mitigate temperature-dependent measurement error during both steady-state (or DC) and transient (or AC) conditions.

The temperature compensation filter 120 receives as inputs the digitized total measured current ($I_T$) generated by the current sensor 114 and the digitized temperature reading (T) measured by the temperature sensor 122. The temperature compensation filter 120 also receives as inputs additional parameters related to the RC current sense networks 112, output inductors ($L_O$), and operation of the controller 106, which can be stored in data registers 128 of the controller 106.

The temperature compensation filter 120 implements a linear first-order transfer function with a programmable gain, pole and zero. The input of the filter 120 corresponds to the measured voltage across the capacitor of an RC current sense network 112. If the gain of the filter 120 is set to 1/DCR, the pole of the filter 120 is set to 1/RC, and the zero of the filter is set to DCR/L, then the output of the filter 120 is a dynamically accurate estimate of the current through the inductor. The programmable gain, pole and zero can be varied over temperature such that those values correspond to the temperature-dependent DCR, DCR/L, and RC values. The ability to change the pole/zero placement of the filter 120 under nominal conditions means the time constant of the RC current sense network 112 does not necessarily have to match the time constant of the inductor and its DCR under nominal conditions. The temperature compensation can be implemented using a look-up table, piecewise linear, temperature slope compensation, or higher-order function. The temperature compensation filter 120 thus allows the controller 106 to estimate the current through the inductor while compensating for temperature variation in the system.

Coefficients ($k_1$, $k_2$) of the temperature compensation filter 120 are determined as a function of the parameters input to the filter 120. For example, the controller 106 calculates a first one ($k_1$) of the filter coefficients as given by:

$$k_1 = \tau_C \Delta_T / \tau_L. \qquad (1)$$

where $\tau_C = R_{sen} \times C_{sen}$, $\Delta_T = \alpha(T-T_0)$, $\tau_L = L_O/DCR$, $\alpha$ is the temperature coefficient of resistivity of the material from which the output inductor(s) are constructed (e.g. 0.0038/K for copper), $R_{sen}$ is resistance of the resistor of the corresponding RC current sense network 112, $C_{sen}$ is the capacitance of the capacitor of the RC current sense network 112, $L_O$ is the inductance of the corresponding inductor, and DCR is the non-ideal DC resistance of the inductor (specified at nominal conditions). The supplier of an inductor typically specifies the DCR of the inductor in Ohms at a certain temperature e.g. 0.5 milliohms at 25° C. As such, filter coefficient $k_1$ is a function of a time constant ($\tau_C$) for the RC current sense network 112 that measures the current through an output inductor of the regulator 100, a time constant ($\tau_L$) for the inductor and a temperature parameter ($\Delta_T$) that is a function of a difference between the measured temperature (T) and the temperature ($T_0$) at which the DCR of the inductor is specified. As such, the controller 106 uses the measured temperature (T) to compensate for the temperature variation between the DCR and inductance of the inductor during both steady-state (or DC) and transient (or AC) conditions.

The controller 106 calculates a second one ($k_2$) of the filter coefficients as given by:

$$k_2 = (1-(1+\Delta_T)/(F_S\tau_L)) \quad (2)$$

where $F_S$ is the sampling frequency at which the inductor currents are estimated by the current sensor 114. The digital temperature compensation filter 120 is implemented by the controller 106 as shown in FIG. 3 using the filter coefficients $k_1$ and $k_2$. For example, the temperature compensation filter 120 can be implemented using a PID (proportional-integral-derivative) controller where filter coefficient $k_1$ is used in the integral term (I) and filter coefficient $k_2$ is used in the derivative term (D). The proportional term (P) can have unity gain or some other gain value.

In general with regard to the temperature compensation embodiment, the controller 106 generates a temperature-compensated total current estimate ($I_{T,comp}$) based on the total measured current ($I_T$) and the filter coefficients ($k_1$, $k_2$) which are a function of the measured temperature (T). The controller 106 can use the temperature-compensated total current estimate to aid in various control functions 126 for the switching voltage regulator 100 such as AVP (adaptive voltage positioning). Dynamic voltage regulation of a switching voltage regulator can be problematic. For example, many output capacitors can be used to reduce voltage spikes that occur during transient periods. However, increasing the number of output capacitors to meet high transient requirements is not a suitable solution because of size and cost issues. AVP is a more feasible way to dynamic voltage regulation. The basic idea behind AVP is to control the output voltage level ($V_O$) so that it is slightly higher than a minimum value at full load, and a little lower than a maximum value at light load. As a result, the entire voltage tolerance window can be used for voltage jumps or drops during transient periods.

The controller 106 can implement an AVP filter 300 that filters the temperature-compensated total current estimate ($I_{T,comp}$) in order to provide dynamic voltage regulation. The filtering implemented by the AVP filter 300 can be a function of the load line ($R_{LL}$) and bandwidth ($\omega_{avp}$) of the AVP filter 300 as shown in FIG. 3. The load line represents the response of the linear part of the switching voltage regulator 100 connected to the (nonlinear) load. The output voltage level ($V_O$) of the switching voltage regulator 100 is controlled by the AVP filter 300 so that the output voltage level is higher than a minimum value at full load and lower than a maximum value at light load. The controller 106 can use the temperature-compensated total current estimate ($I_{T,comp}$) to aid in still other control functions 126 for the switching voltage regulator 100 such as current balance and phase drop/add functions in the case of a multiphase regulator.

Figure 4:
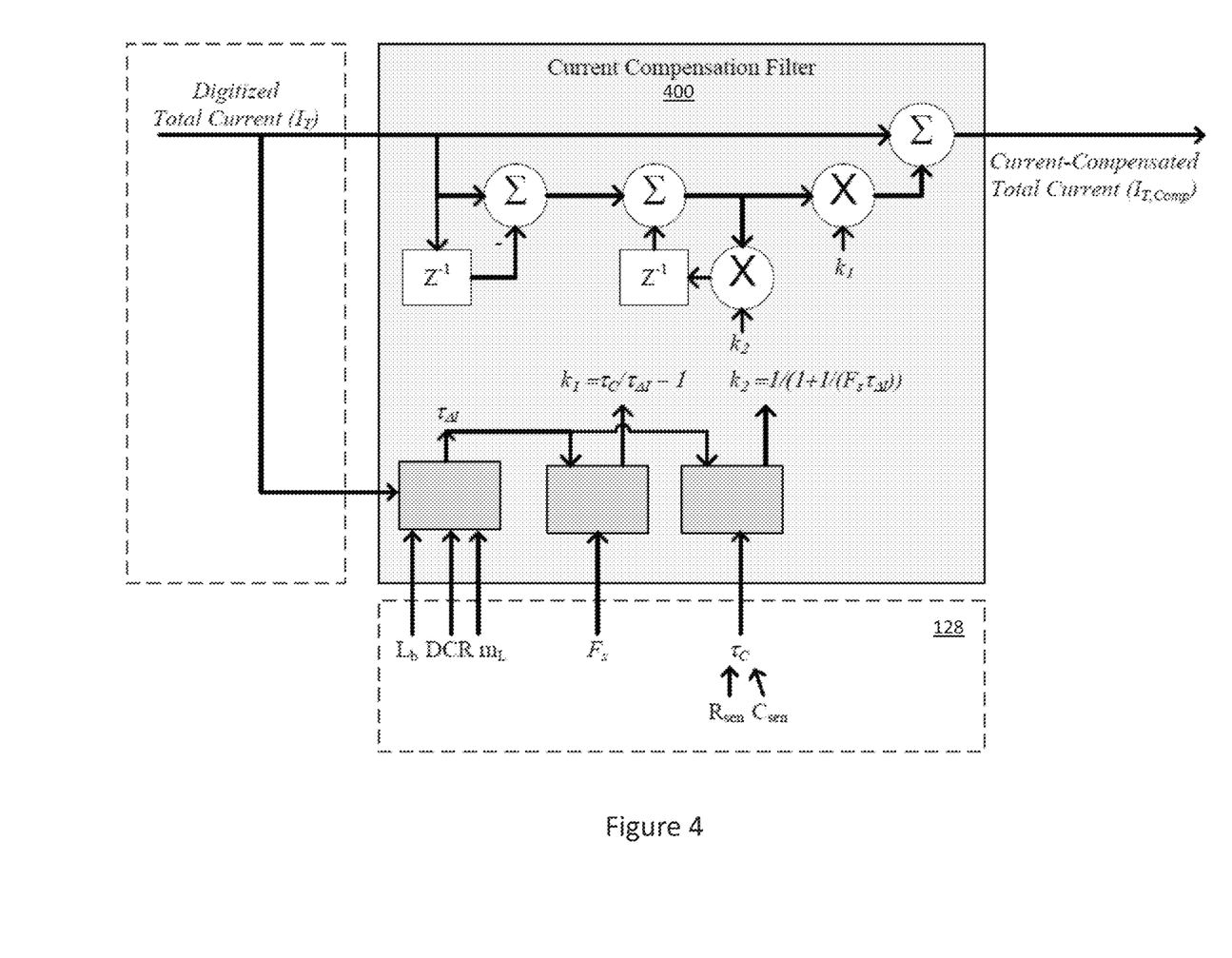
FIG. 4 illustrates a block diagram of an embodiment of a compensation filter that provides current-dependency compensation to a multiphase switching voltage regulator with inductor DCR current sense.

FIG. 4 illustrates an embodiment of a current compensation filter 400 for adjusting the estimate of the digitized current estimate $I_T$ generated by the current sensor 114. According to this embodiment, the current-dependency of the phase inductance is used to implement the current estimate compensation. The structure of the current compensation filter 400 shown in FIG. 4 is similar to the structure of the temperature compensation filter 120 shown in FIG. 3, however the filter coefficients are calculated differently and there is a subtraction sign at the first summation.

Figure 5:
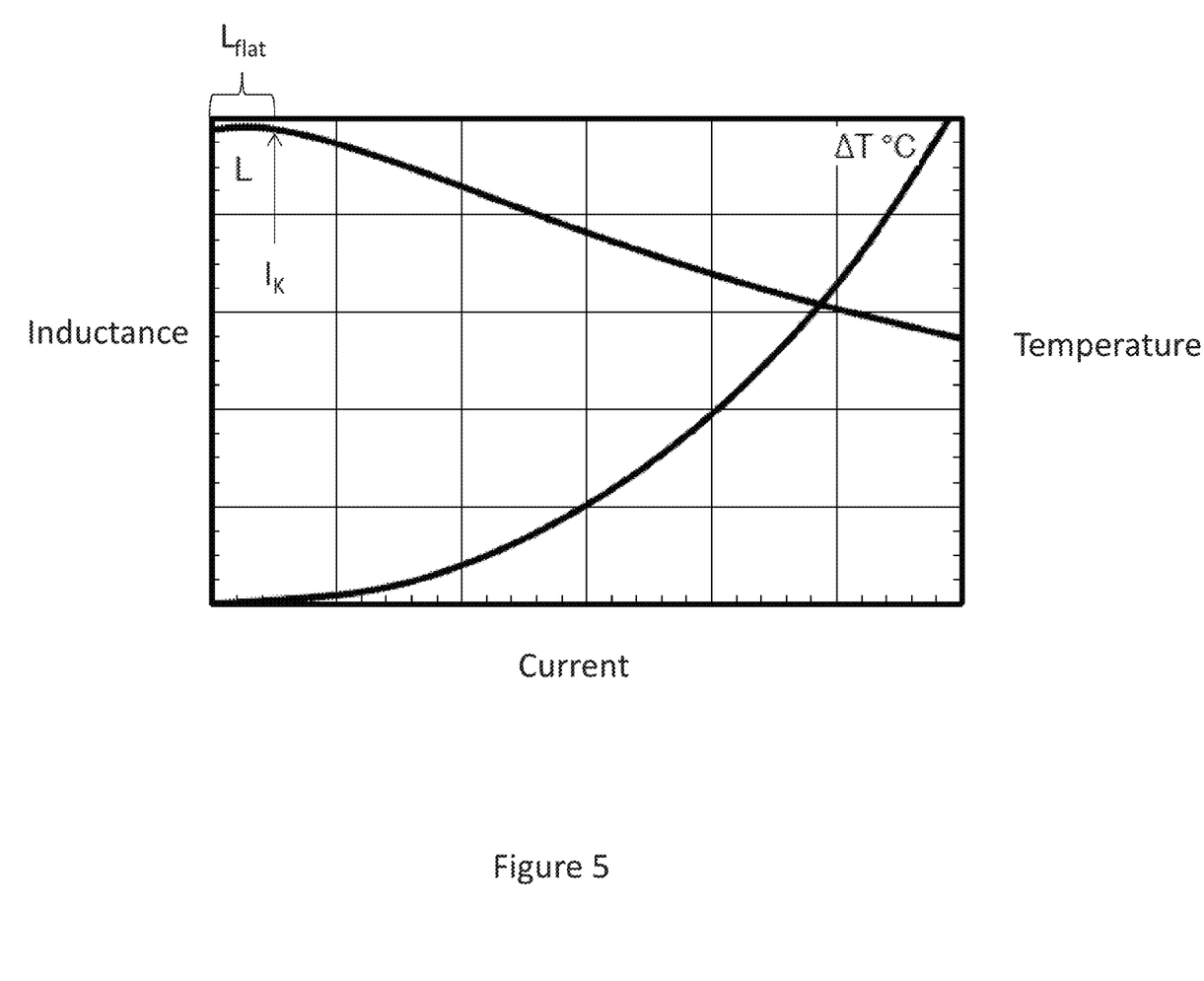
FIG. 5 illustrates a plot diagram showing the current-dependency of the inductance of an inductor of a multiphase switching voltage regulator.

Coefficients ($k_1$, $k_2$) of the current compensation filter 400 are determined as a function of the parameters input to the filter 400. For example, the controller 106 calculates a first one ($k_1$) of the filter coefficients as given by:

$$k_1 = \tau_C/\tau_{\Delta I} - 1 \quad (3)$$

where $\tau_C = R_{sen} \times C_{sen}$ and $\tau_{\Delta I} = L(I)/DCR$. L(I) is an estimate of the inductance as a function of current and is given by:

$$L(I) = m_L I + L_b \quad (4)$$

where $m_L$ is the slope of decrease for the inductance as a function of current, I is current, and $L_b$ is the intercept of the extrapolated slope for the inductance versus current. In one embodiment, the current compensation filter 400 assumes a linear decrease of inductance versus current i.e. $m_L$ is linear. FIG. 5 shows how the inductance of an inductor changes over current (L) and temperature ($\Delta T° C.$). The inductance is relatively flat from 0 A to some current ($I_K$), and then starts to decay in a mostly linear manner.

The controller 106 calculates a second one ($k_2$) of the current compensation filter coefficients as given by:

$$k_2 = 1/(1+1/(F_S\tau_{\Delta I})) \quad (5)$$

where $F_S$ is the sampling frequency at which the inductor currents are estimated by the current sensor 114. The digital current compensation filter 400 is implemented by the controller 106 as shown in FIG. 4 using the filter coefficients $k_1$ and $k_2$. For example, the current compensation filter 400 can be implemented using a PID (proportional-integral-derivative) controller where filter coefficient $k_1$ is used in the integral term (I) and filter coefficient $k_2$ is used in the derivative term (D). The proportional term (P) can have unity gain or some other gain value. In one embodiment, the controller 106 can disable the current compensation filter 400 over a range ($L_{flat}$) of the inductor current for which $m_L$ is relatively flat as shown in FIG. 5. The filter 400 has no effect on the phase current estimates when disabled. The filter 400 can be disabled by setting the coefficients $k_1$ and $k_2$ to 1.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of current estimation for a switching voltage regulator that delivers current to a load through an inductor, the method comprising:
measuring a voltage across a capacitor of an RC current sense network coupled in parallel with the inductor;
generating a digitized current value which estimates the current through the inductor, based on the voltage measured across the capacitor of the RC current sense network and a specified DCR (non-ideal DC resistance) value for the inductor at nominal conditions; and
adjusting the digitized current value by a compensation filter that compensates for at least one of temperature and current variation of the specified DCR value and the inductance of the inductor.

2. The method of claim 1, further comprising measuring a temperature of the switching voltage regulator, wherein the RC current sense network accounts for the DCR of the inductor and the compensation filter compensates for temperature variation between the specified DCR value and the inductance of the inductor as a function of the measured temperature, the compensation filter comprising a plurality of filter coefficients that are a function of the measured temperature.

3. The method of claim 2, further comprising:
calculating a first one of the plurality of filter coefficients as a function of a time constant ($\tau_C$) for the RC current sense network, a time constant ($\tau_L$) for the inductor and a temperature parameter ($\Delta_T$) that is a function of the difference between the measured temperature and a temperature at which the DCR value of the inductor is specified; and
calculating a second one of the plurality of filter coefficients as a function of $\tau_L$, $\Delta_T$ and a sampling frequency at which the digitized current value is estimated.

4. The method of claim 3, further comprising:
calculating $\Delta_T = \alpha(T-T_0)$ where $\alpha$ is a temperature coefficient of resistivity for the inductor, T is the measured temperature and $T_0$ is the temperature at which the DCR value of the inductor is specified.

5. The method of claim 2, wherein the measured temperature is used to compensate for the temperature variation between the specified DCR value and the inductance of the inductor during transient load conditions.

6. The method of claim 2, further comprising providing over-temperature protection for the switching voltage regulator based on the same measured temperature used to compensate for the temperature variation between the specified DCR value and the inductance of the inductor.

7. The method of claim 1, wherein the RC current sense network accounts for the DCR of the inductor and the compensation filter compensates for a current-dependency of the inductance of the inductor, the compensation filter comprising a plurality of filter coefficients that are a function of the current-dependency of the inductance.

8. The method of claim 7, further comprising:
calculating a first one of the plurality of filter coefficients as a function of a time constant ($\tau_C$) for the RC current sense network and a time constant ($\Sigma_{AI}$) for the inductance of the inductor as a function of current through the inductor; and
calculating a second one of the plurality of filter coefficients as a function of $\tau_{AI}$ and a sampling frequency at which the digitized current value is estimated generated.

9. The method of claim 8, further comprising:
calculating $\tau_{AI} = L(I)/DCR$ and $L(I) = m_L I + L_b$ where $L(I)$ is an estimate of the inductance as a function of current, DCR is the specified DCR value of the inductor, $m_L$ is a slope of decrease for the inductance as a function of current, I is current, and $L_b$ is an intercept of an extrapolated slope for the inductance versus current.

10. The method of claim 9, wherein the compensation filter assumes a linear decrease $m_L$.

11. The method of claim 9, further comprising disabling the compensation filter over a range of the inductor current for which $m_L$ is relatively flat.

12. A controller for controlling operation of a switching voltage regulator that delivers current to a load through an inductor, the controller comprising:
an RC current sense network coupled in parallel with the inductor;
a current estimator operable to generate a digitized current value which estimates the current through the inductor based on a voltage measured across the capacitor of the RC current sense network and a specified DCR (non-ideal DC resistance) value for the inductor at nominal conditions; and
a compensation filter operable to adjust the digitized current value by compensating for at least one of temperature and current variation of the specified DCR value and the inductance of the inductor.

13. The controller of claim 12, further comprising a temperature sensor operable to measure a temperature of the switching voltage regulator, wherein the RC current sense network accounts for the DCR of the inductor and the compensation filter is operable to compensate for temperature variation between the specified DCR value and the inductance of the inductor as a function of the measured temperature, the compensation filter comprising a plurality of filter coefficients that are a function of the measured temperature.

14. The controller of claim 13, wherein:
a first one of the plurality of filter coefficients is calculated as a function of a tune constant ($\tau_C$) for the RC current sense network, a time constant ($\tau_L$) for the inductor and a temperature parameter ($\Delta_T$) that is a function of the difference between the measured temperature and a temperature at which the DCR value of the inductor is specified; and
a second one of the plurality of filter coefficients is calculated as a function of $\tau_L$, $\Delta_T$ and a sampling frequency at which the digitized current value is estimated.

15. The controller of claim 14, wherein $\Delta_T = \alpha(T-T_0)$, $\alpha$ is a temperature coefficient of resistivity for the inductor, and T is the measured temperature and $T_0$ is the temperature at which the DCR value of the inductor is specified.

16. The controller of claim 13, further comprising an over-temperature protection circuit operable to provide over-temperature protection for the switching voltage regulator based on the same measured temperature used to compensate for the temperature variation between the specified DCR value and the inductance of the inductor.

17. The controller of claim 13, wherein a time constant of the RC current sense network does not match the time constant of the inductor and the specified DCR of the inductor.

18. The controller of claim 12, wherein the RC current sense network accounts for the DCR of the inductor and the compensation filter is operable to compensate for a current-dependency of the inductance of the inductor, the compensation filter comprising a plurality of filter coefficients that are a function of the current-dependency of the inductance.

19. The controller of claim 18, wherein:
    a first one of the plurality of filter coefficients is calculated as a function of a time constant ($\tau_C$) for the RC current sense network and a time constant ($\tau_{AI}$) for the inductance of the inductor as a function of current through the inductor; and
    a second one of the plurality of filter coefficients is calculated as a function of $\tau_{AI}$ and a sampling frequency at which the digitized current value is estimated.

20. The controller of claim 19, wherein $\tau_{AI}$=L(I)/DCR and L(I)=$m_L$I+$L_b$, L(I) is an estimate of the inductance as a function of current, DCR is the specified DCR value for the inductor, $m_L$ is a slope of decrease for the inductance as a function of current, I is current, and $L_b$ is an intercept of an extrapolated slope for the inductance versus current.

21. The controller of claim 20, wherein the controller is further operable to disable the compensation filter over a range of the inductor current for which $m_L$ is relatively flat.

22. A multiphase switching voltage regulator, comprising:
    a plurality of phases operable to deliver current to a load, each phase being connected to the load through an inductor;
    an RC current sense network coupled in parallel with each of the inductors;
    a current estimator operable to generate a digitized current value which estimates the individual currents through the inductors based on a voltage measured across the capacitors of the RC current sense networks and a specified DCR (non-ideal DC resistance) value for the inductors at nominal conditions, and generate a total digitized current value based of the digitized current values for the inductors; and
    a compensation filter operable to adjust the total digitized current value by compensating for variation in at least one of temperature and current of the specified DCR value for the inductors and the inductance of the inductors.

* * * * *

UNITED STATES PATENT AND TRADEMARK OFFICE
CERTIFICATE OF CORRECTION

PATENT NO. : 9,627,969 B2  
APPLICATION NO. : 14/287978  
DATED : April 18, 2017  
INVENTOR(S) : D. Tschirhart et al.

Page 1 of 1

It is certified that error appears in the above-identified patent and that said Letters Patent is hereby corrected as shown below:

In the Claims

Column 9, Line 61 (Claim 8, Line 4) please change "time constant ($\Sigma_{\Delta t}$)" to -- time constant ($\tau_{\Delta t}$) --
Column 9, Lines 66, 67 (Claim 8, Lines 9, 10) please change "estimated generated." to -- estimated. --
Column 10, Line 40 (Claim 14, Line 3) please change "a tune" to -- a time --
Column 12, Line 13 (Claim 22, Line 13) please change "based of the" to -- based on the --

Signed and Sealed this
Eighteenth Day of July, 2017

Joseph Matal
*Performing the Functions and Duties of the*
*Under Secretary of Commerce for Intellectual Property and*
*Director of the United States Patent and Trademark Office*